(12) United States Patent
Yang et al.

(10) Patent No.: US 12,013,729 B2
(45) Date of Patent: Jun. 18, 2024

(54) FLEXIBLE SUPPORT PLATE, AND METHOD FOR MANUFACTURING SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Hufei Yang, Beijing (CN); Liang Gao, Beijing (CN); Ajuan Du, Beijing (CN); Feifan Li, Beijing (CN); Hao Sun, Beijing (CN); Xiaoxia Huang, Beijing (CN); Bin Wang, Beijing (CN); Yongle Wang, Beijing (CN); Enjian Yang, Beijing (CN); Shuang Zhang, Beijing (CN); Bowen Xiao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 371 days.

(21) Appl. No.: 17/439,879

(22) PCT Filed: Jan. 29, 2021

(86) PCT No.: PCT/CN2021/074442
§ 371 (c)(1),
(2) Date: Sep. 16, 2021

(87) PCT Pub. No.: WO2022/160259
PCT Pub. Date: Aug. 4, 2022

(65) Prior Publication Data
US 2023/0085742 A1  Mar. 23, 2023

(51) Int. Cl.
*G06F 1/16* (2006.01)

(52) U.S. Cl.
CPC .......... *G06F 1/1656* (2013.01); *G06F 1/1616* (2013.01); *G06F 1/1652* (2013.01)

(58) Field of Classification Search
CPC .............................. G06F 1/1616; G06F 1/1652
See application file for complete search history.

(56) References Cited

U.S. PATENT DOCUMENTS 10,074,824 B2 * 9/2018 Han ..................... H05K 5/0017
11,662,780 B2 * 5/2023 Park ..................... G06F 1/1616
                                                   361/679.01
(Continued)

FOREIGN PATENT DOCUMENTS

CN    109523921 A    3/2019
CN    110010001 A    7/2019
(Continued)

*Primary Examiner* — Anthony Q Edwards
(74) *Attorney, Agent, or Firm* — Lippes Mathias LLP

(57) ABSTRACT

A flexible support plate is configured to support a display panel, and is provided with a bendable region. The bendable region has at least one boundary line extending in a first direction, and the boundary line is part of a side of the flexible support plate. A plurality of hollows are arranged at intervals in the bendable region, the plurality of hollows are divided into a plurality of hollow groups arranged in the first direction, and each hollow group includes at least one hollow. For any boundary line, any one of the plurality of hollow groups has one boundary point, the boundary point is disposed on a contour line of a hollow in the hollow group to which the boundary point belongs, and the boundary point has a smallest distance from a corresponding boundary line in the contour line to which the boundary point belongs.

19 Claims, 13 Drawing Sheets

(56) References Cited

U.S. PATENT DOCUMENTS

| | | | |
|---|---|---|---|
| 2016/0357052 A1 | 12/2016 | Kim et al. | |
| 2019/0132947 A1* | 5/2019 | Koo | G09F 9/301 |
| 2019/0207141 A1 | 7/2019 | Kim et al. | |
| 2020/0194698 A1 | 6/2020 | Zhai | |
| 2021/0153363 A1 | 5/2021 | Cao et al. | |
| 2021/0165454 A1 | 6/2021 | Dong et al. | |
| 2021/0286407 A1* | 9/2021 | Kim | G06F 1/1652 |

FOREIGN PATENT DOCUMENTS

| | | | |
|---|---|---|---|
| CN | 110649087 A | 1/2020 | |
| CN | 110767086 A | 2/2020 | |
| CN | 110767096 A | 2/2020 | |
| CN | 110992828 A | 4/2020 | |
| CN | 111627337 A | 9/2020 | |
| CN | 111816074 A | 10/2020 | |
| CN | 112071207 A | 12/2020 | |
| CN | 112086570 A | 12/2020 | |
| CN | 112150926 A | 12/2020 | |
| JP | H11271793 A | 10/1999 | |
| KR | 20200052167 A | 5/2020 | |

\* cited by examiner

FLEXIBLE SUPPORT PLATE, AND METHOD FOR MANUFACTURING SAME

CROSS-REFERENCE TO RELATED APPLICATION

This application is a 371 of PCT Application No. PCT/CN2021/074442, filed on Jan. 29, 2021, the disclosure of which is incorporated herein by reference in its entirety.

TECHNICAL FIELD

The present disclosure relates to the field of display technologies, and in particular to a flexible support plate, a method for manufacturing the same, and a display device.

BACKGROUND

A foldable display device is increasingly applied to the field of displays, and a user may adjust a screen size of the foldable display device according to an actual requirement.

The foldable display device includes a flexible support plate and a display panel. The flexible support plate supports the display panel to ensure the appearance form of the entire foldable display device. The display panel is provided with a first plane display region, a bendable display region, and a second plane display region that are connected in sequence. The flexible support plate is provided with a first plane region, a bendable region, and a second plane region that are in a one-to-one correspondence with the first plane display region, the bendable display region, and the second plane display region.

The bendable region of the flexible support plate is provided with a plurality of hollows that are arranged at intervals to improve the bending performance of the flexible support plate in the bendable region. The bendable region of the flexible support plate has a boundary line extending in a first direction. The plurality of hollows are divided into a plurality of hollow groups arranged in the first direction. Each hollow group has a boundary point closest to a corresponding boundary line. In the related art, a connecting line of boundary points has a zigzag shape. In a process of bending the flexible support plate, a phenomenon of stress concentration occurs at boundaries of the hollows, which easily causes damage to the flexible support plate.

SUMMARY

In an aspect, embodiments of the present disclosure provide a flexible support plate. The flexible support plate is configured to support a display panel. The flexible support plate is provided with a bendable region. The bendable region has at least one boundary line extending in a first direction. The boundary line is part of a side of the flexible support plate. A plurality of hollows are arranged at intervals in the bendable region. The plurality of hollows are divided into a plurality of hollow groups arranged in the first direction. Each hollow group includes at least one hollow. For any boundary line, any one of the plurality of hollow groups has one boundary point. The boundary point is disposed on a contour line of a hollow in the hollow group to which the boundary point belongs, and the boundary point has a smallest distance from a corresponding boundary line in the contour line to which the boundary point belongs; and a connecting line of boundary points that are close to a same boundary line is a line segment.

In another aspect, embodiments of the present disclosure provide a method for manufacturing a flexible support plate. The method includes: providing a substrate, wherein the substrate is provided with a bendable region, the bendable region has at least one boundary line extending in a first direction, and the boundary line is part of a side of the substrate; and forming a plurality of hollows in the bendable region, to acquire a flexible support plate, wherein the plurality of hollows are divided into a plurality of hollow groups arranged in the first direction, each hollow group includes at least one hollow, for any boundary line, any one of the plurality of hollow groups has one boundary point, the boundary point is disposed on a contour line of a hollow in the hollow group to which the boundary point belongs, and the boundary point has a smallest distance from a corresponding boundary line in the contour line to which the boundary point belongs, and a connecting line of boundary points that are close to a same boundary line is a line segment.

BRIEF DESCRIPTION OF THE DRAWINGS

To describe the technical solutions in the embodiments of the present disclosure more clearly, the following briefly introduces accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

Embodiments of the present disclosure provide a flexible support plate, a method for manufacturing the same, and a display device, such that a phenomenon of stress concentration in a process of bending the flexible support plate can be improved. The technical solutions are as follows.

For clearer descriptions of the objectives, technical solutions, and advantages of the present disclosure, embodiments of the present disclosure are described in detail hereinafter with reference to the accompanying drawings.

Figure 1:
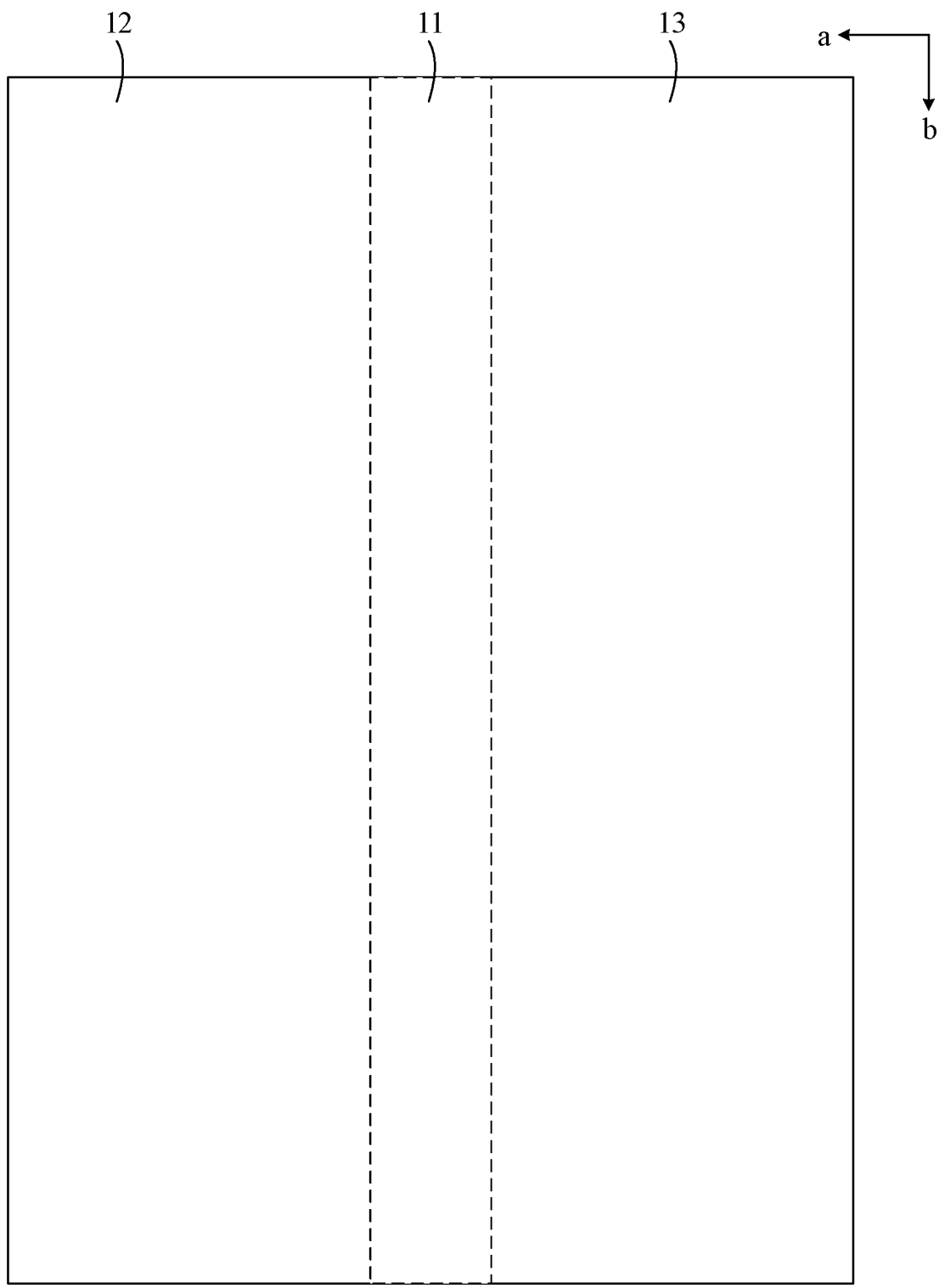
FIG. 1 is a schematic diagram of a top view structure of a foldable display device according to an embodiment of the present disclosure when it is unfolded.

FIG. 1 is a schematic diagram of a top view structure of a foldable display device according to an embodiment of the present disclosure when it is unfolded. Referring to FIG. 1, the foldable display device is provided with a bendable display region 11, a first plane display region 12, and a second plane display region 13. The bendable display region 11 is separately connected to the first plane display region 12 and the second plane display region 13.

Figure 2:
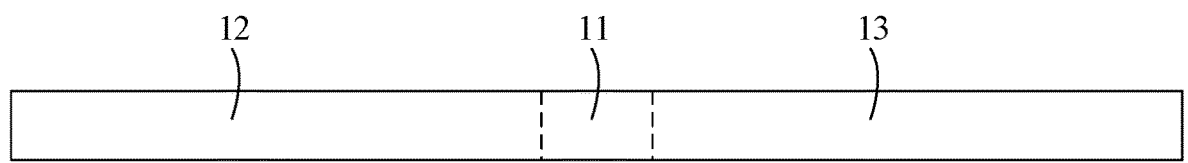
FIG. 2 is a schematic cross-sectional view of a foldable display device according to an embodiment of the present disclosure when it is unfolded.

FIG. 2 is a schematic cross-sectional view of a foldable display device according to an embodiment of the present disclosure when it is unfolded. Referring to FIGS. 1 and 2, when the foldable display device is unfolded, a first plane display region 12, a bendable display region 11, and the second plane display region 13 are in the same plane and jointly display a picture. In this case, an area of a display region of the foldable display device is larger, which can meet the user's viewing needs.

Figure 3:
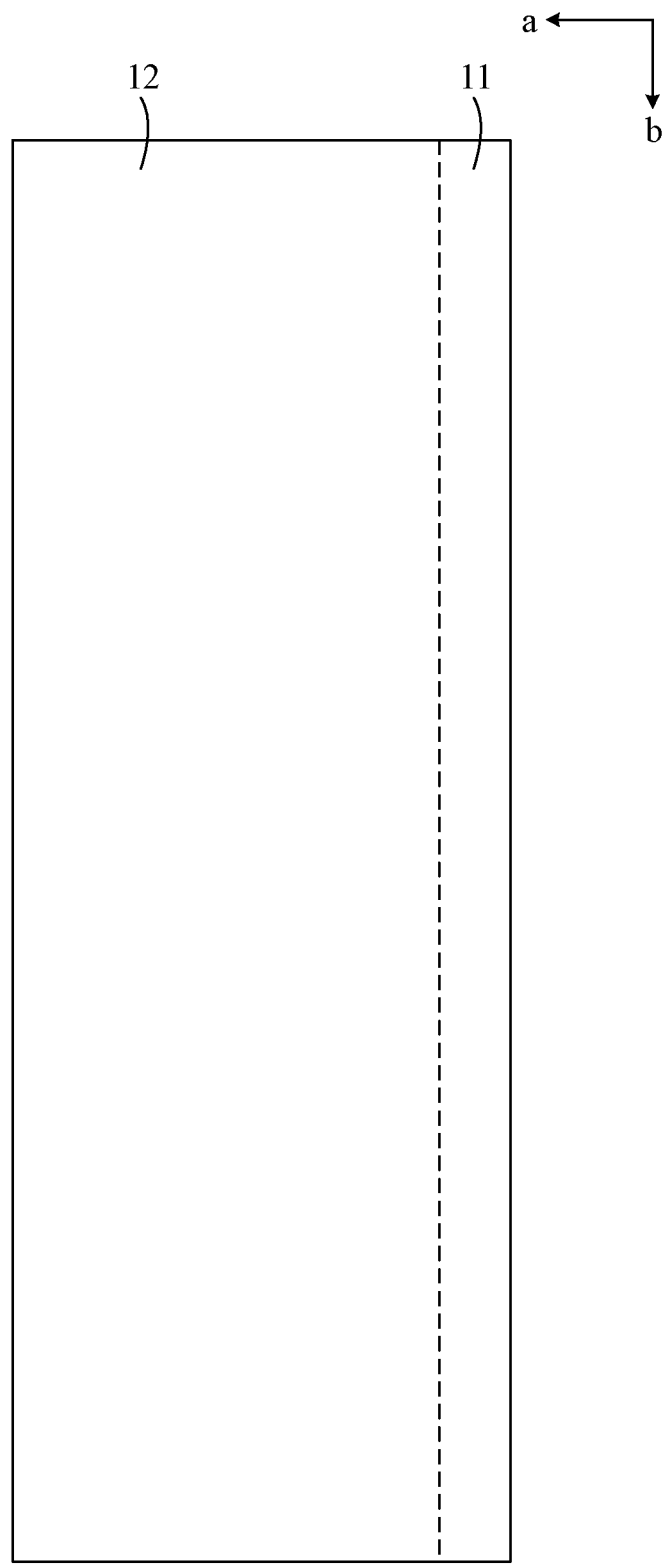
FIG. 3 is a schematic diagram of a top view structure of a foldable display device according to an embodiment of the present disclosure when it is folded.

FIG. 3 is a schematic diagram of a top view structure of a foldable display device according to an embodiment of the present disclosure when it is folded. Referring to FIG. 3, when the foldable display device is folded, an area of a display region of a foldable display device is smaller, which causes the foldable display device more portable.

Figure 4:
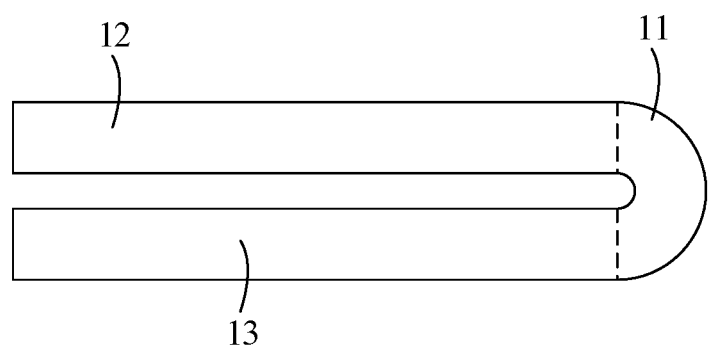
FIG. 4 is a schematic cross-sectional view of a foldable display device according to an embodiment of the present disclosure when it is folded.

FIG. 4 is a schematic cross-sectional view of a foldable display device according to an embodiment of the present disclosure when it is folded. Referring to FIG. 4, when the foldable display device is folded, a second plane display region 13 is bent to a rear side of a first plane display region 12. In this case, the second plane display region 13 and the first plane display region 12 are on different planes.

A flexible support plate provided in the embodiment of the present disclosure is configured to support a display panel of the foldable display device to ensure the form of the foldable display device. A bending can be implemented when a screen form of the foldable display device is changed so as to ensure that the foldable display device can display normally.

Figure 5:
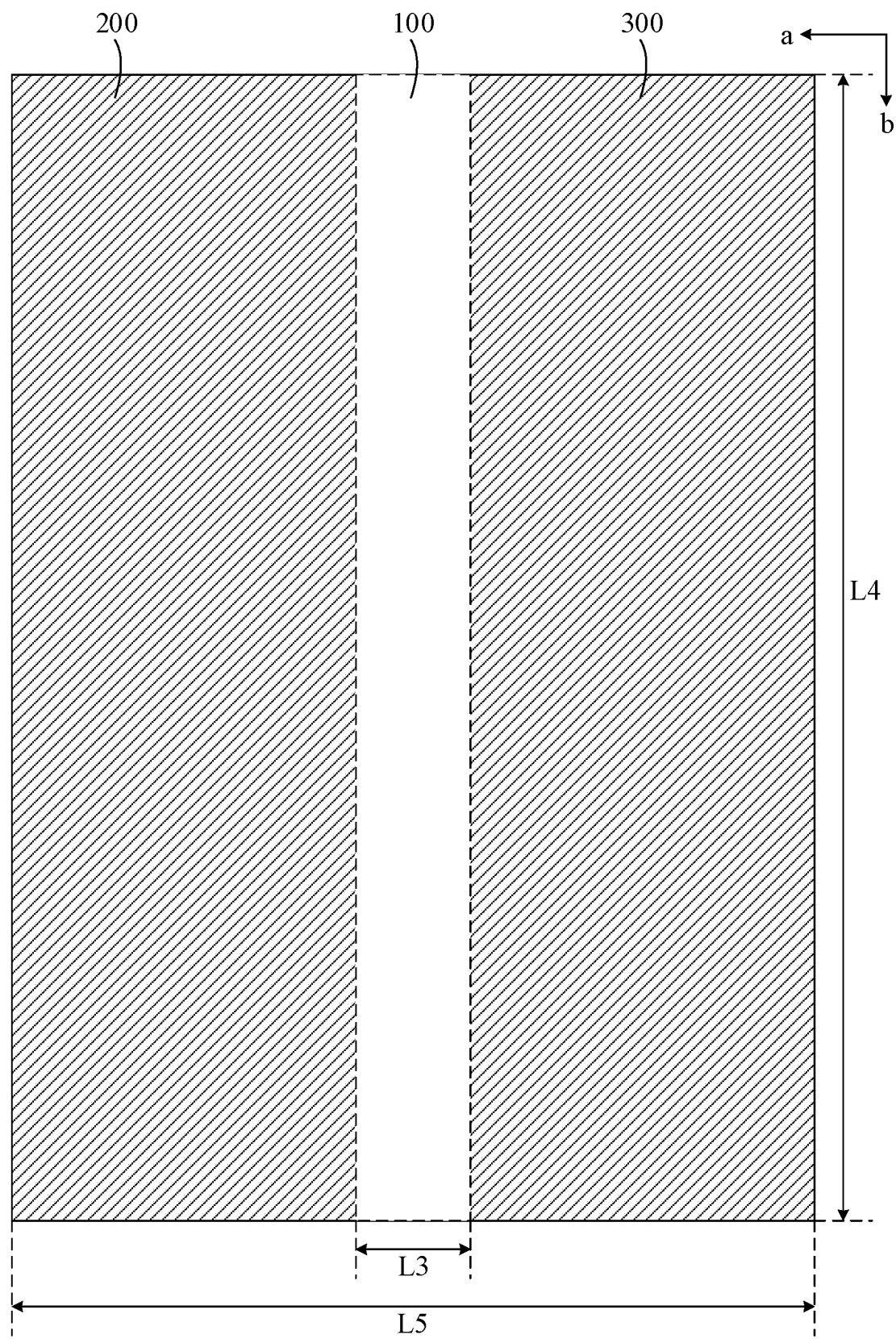
FIG. 5 is a schematic diagram of a top view structure of a flexible support plate according to an embodiment of the present disclosure when it is unfolded.

FIG. 5 is a schematic diagram of a top view structure of a flexible support plate according to an embodiment of the present disclosure when it is unfolded. Referring to FIG. 5, the flexible support plate is provided with a first plane region 200, a bendable region 100, and a second plane region 300 that are connected in sequence. In the embodiment of the present disclosure, the flexible support plate has support and bending performance in both the first plane region 200 and the second plane region 300. The first plane region 200 and the second plane region 300 are entire plate structures without hollows. Compared with the bendable region 100, the first plane region 200 and the second plane region 300 have better strength and better support. Compared with the first plane region 200 and the second plane region 300, the bendable region 100 being provided with hollows has a better capability of absorbing stress and strain and better bending performance.

The first plane region 200 is opposite to the first plane display region 12, the bendable region 100 is opposite to the bendable display region 11, and the second plane region 300 is opposite to the second plane display region 13.

Figure 6:
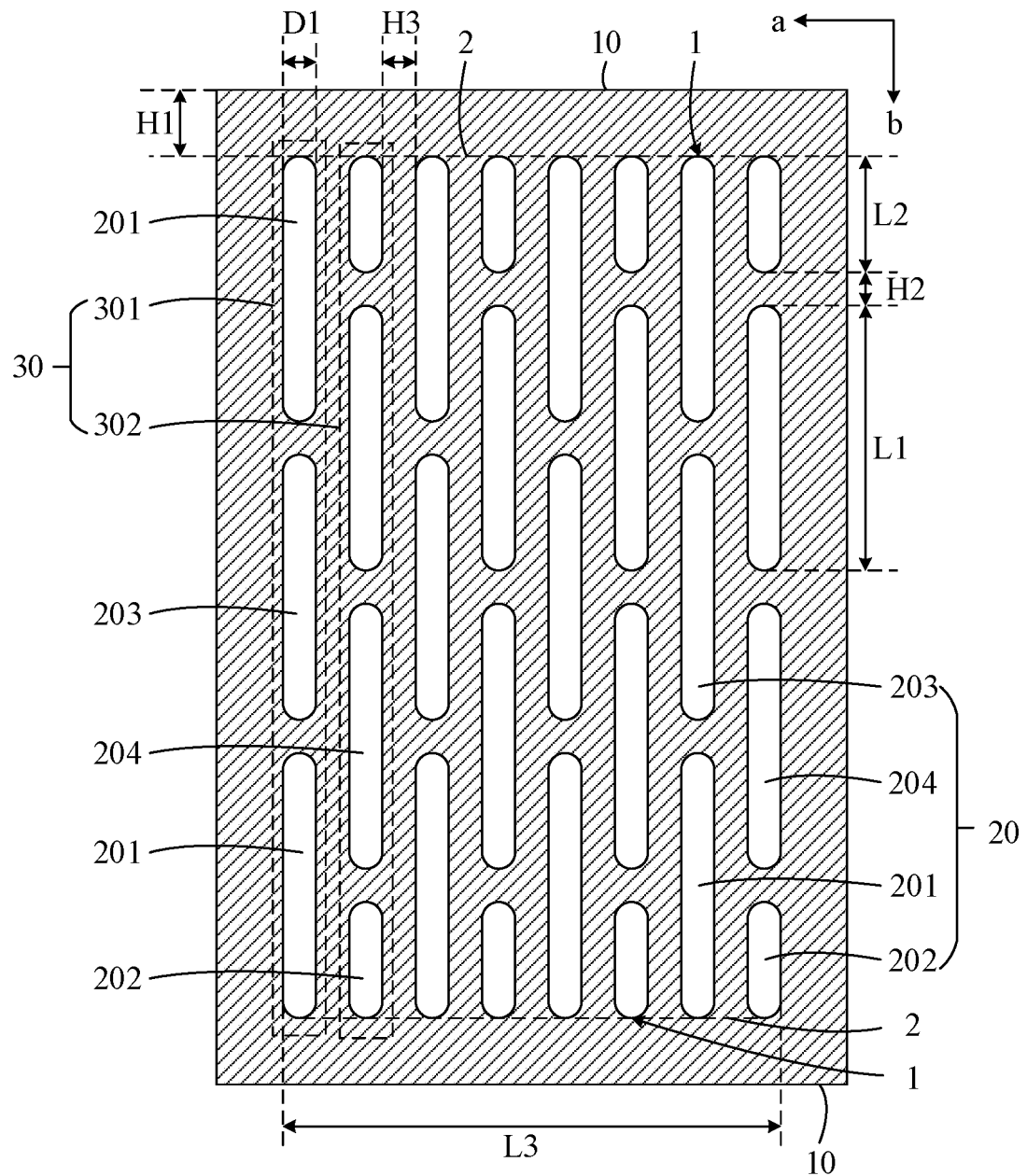
FIG. 6 is a partial enlarged view of a bendable region of a flexible support plate according to an embodiment of the present disclosure.

FIG. 6 is a partial enlarged view of a bendable region of a flexible support plate according to an embodiment of the present disclosure. Referring to FIG. 6, the bendable region 100 has at least one boundary line 10 extending in a first direction a. The boundary line 10 is part of a side of the flexible support plate. A plurality of hollows 20 are arranged at intervals in the bendable region 100. The plurality of hollows 20 are divided into a plurality of hollow groups 30 arranged in the first direction a. Each hollow group 30 includes at least one hollow 20. For any boundary line 10, any one of in the plurality of hollow groups 30 has one boundary point 1. The boundary point 1 is disposed on a contour line of a hollow 20 in the hollow group 30 to which the boundary point 1 belongs, and the boundary point 1 has the smallest distance from a corresponding boundary line 10 in the contour line to which the boundary point 1 belongs. A connecting line of boundary points 1 that are close to the same boundary line 10 is a line segment 2.

A phenomenon of stress concentration of an object usually occurs at a position where a shape of the object changes rapidly, for example, at a notch, at a groove, or the like. In the flexible support plate provided in the embodiment of the present disclosure, for any boundary line, boundary points of each of the hollow groups in a bendable region are at the same line segment. In this case, a connecting line of hollows that is close to a boundary line is smooth, such that a boundary of the hollow in the flexible support plate has a smooth transition, and there is no notch, groove, or the like. When the flexible support plate provided in the embodiment of the present disclosure is bent in the bendable region, a phenomenon of stress concentration at a boundary of a hollow can be improved, thereby reducing a possibility of damaging the flexible support plate.

In the embodiment of the present disclosure, the flexible support plate is a titanium plate or an alloy plate. The titanium plate and alloy plate not only have certain strength to ensure the support performance of the flexible support plate, but also, the titanium plate and alloy plate have certain bendability to ensure the bending performance of the flexible support plate.

For example, the alloy plate is a stainless steel (SUS) plate.

In an implementation of the embodiments of the present disclosure, a range of a thickness of the flexible support plate is 100 micrometers (μm) to 200 μm.

In the embodiment of the present disclosure, because the flexible support plate is provided with the hollows 20 in the bendable region 100, the strength and support of the flexible support plate in the bendable region 100 are weak. The thickness of the flexible support plate is restricted between 100 μm and 200 μm. In an aspect, it avoids that since the flexible support plate is excessively thin, the strength and support of the flexible support plate in the bendable region 100 are weakened and the flexible support plate from is damaged. In another aspect, it avoids that the flexible support plate is excessively thick, which increases a thickness of a foldable display device.

In the embodiment of the present disclosure, when the flexible support plate is configured to support display panels of different display devices, the flexible support plate has different thicknesses.

In the embodiment of the present disclosure, the line segment 2 does not actually exist in the flexible support plate, and is only a virtual line segment used for showing that connecting lines of the boundary points 1 of the plurality of hollow groups 30 are at the same line segment.

In an implementation of the embodiments of the present disclosure, the line segment 2 is parallel to the boundary line 10. In this case, the hollow groups 30 have equal distances from the boundary line 10, such that boundaries of the hollow groups 30 have smoother transitions, a phenomenon of stress concentration is further improved, and the possibility of the flexible support plate being damaged is decreased.

In the embodiment of the present disclosure, there is a first spacing H1 between the line segment 2 and the boundary line 10, such that the boundary of the bendable region 100 is provided with an edge seal, the strength of the bendable region 100 at the boundary is increased, and a possibility of the flexible support plate being damaged is decreased. In a case that there is a spacing between two objects, it indicates that the two objects are not adjacent.

In the embodiment of the present disclosure, a range of the first spacing H1 between the line segment 2 and the boundary line 10 is 0.2 mm to 1 mm. A size of the first spacing H1 between the line segment 2 and the boundary line 10 is controlled to ensure that there is sufficient space in the bendable region 100 for arranging the hollows 20, improve the bending performance of the flexible support plate, and facilitate the bending of the flexible support plate.

In another implementation of the embodiments of the present disclosure, the line segment 2 may be not parallel to the boundary line 10, but simply ensure that there is a gap between the line segment 2 and the boundary line 10.

In the embodiment of the present disclosure, in a second direction b, second spacings H2 between two adjacent hollows 20 are equal. In this way, in the second direction b, widths of connecting portions between two adjacent hollows 20 are equal, thereby ensuring the uniformity of the support of the flexible support plate in the bendable region 100. In addition, the hollows 20 in the bendable region 100 may be staggered to achieve a mesh form.

In the embodiment of the present disclosure, in the second direction b, a range of the second spacing H2 between two adjacent hollows 20 is 0.05 mm to 0.15 mm.

In the embodiment of the present disclosure, limiting the second spacing H2 between two adjacent hollows 20 in the second direction b allows more hollows to be arranged in the bendable region 100 of the flexible support plate, thereby improving the bending performance of the flexible support plate in the bendable region 100.

For example, the second spacing H2 is 0.1 mm.

As shown in FIG. 6, the bendable region 100 has two boundary lines 10 extending in the first direction a. Each hollow group 30 has two boundary points 1 relative to the two boundary lines 10. The connecting lines of the boundary points 1 disposed on the same side of the hollow groups 30 are disposed on the same line segment 2. That is, the boundaries on two sides of the hollow groups 30 both have smooth transitions, and there is no notch, groove, or the like. A phenomenon of stress concentration at a boundary of a hollow 20 when the flexible support plate is bent in the bendable region can be further improved and the possibility of the flexible support plate being damaged is decreased.

As shown in FIG. 6, the hollow groups 30 include a plurality of alternating rows of first hollow groups 301 and second hollow groups 302, the hollows 20 in the first hollow group 301 and the hollows 20 in the second hollow group 302 all extend and are arranged in the second direction b, and the second direction b is an extension direction of a bending line when the bendable region 100 is bent.

In the embodiment of the present disclosure, both the hollows 20 in the first hollow group 301 and both the hollows 20 in the second hollow group 302 extend in the second direction b, and both the hollows 20 in the first hollow group 301 and both the hollows 20 in the second hollow group 302 are arranged in the second direction b. That is, the entire bendable region 100 also extends in the second direction b, making the bendable region 100 easier to bend.

Referring to FIG. 6 again, the hollow 20 closest to a corresponding boundary line 10 in the first hollow group 301 is a first hollow 201, and the hollow 20 closest to the corresponding boundary line 10 in the second hollow group 302 is a second hollow 202. In the second direction b, a length L1 of the first hollow 201 is different from a length L2 of the second hollow 202.

Because the length L1 of the first hollow 201 is different from the length L2 of the second hollow 202, the structure of the first hollow group 301 is different from the structure of the second hollow group 302, such that the hollows in the first hollow group 301 and the hollows in the second hollow group 302 can be staggered with each other. That is, the hollows 20 in the bendable region 100 are staggered. In this case, the connecting portions between two adjacent hollows 20 are also staggered, such that the support of the flexible support plate in the bendable region 100 can be improved.

The connecting portion between two adjacent hollows 20 is a plate structure in which no hollow is manufactured.

As shown in FIG. 6, the hollows 20 in the first hollow group 301 include two first hollows 201 and at least one third hollow 203. The at least one third hollow 203 is disposed between the two first hollows 201. The hollows 20 in the second hollow group 302 include two second hollows 202 and at least one fourth hollow 204. The at least one fourth hollow 204 is disposed between the two second hollows 202. A shape of the third hollow 203 and a shape of the fourth hollow 204 are both the same as a shape of the first hollow 201, and a size of the third hollow 203 and a size of the fourth hollow 204 are both the same as a size of the first hollow 201.

Because the shape and size of the third hollow 203 are respectively the same as the shape and size of the first hollow 201. That is, the hollows 20 in the first hollow group 301 are all first hollows 201, and it is not necessary to change shapes of the hollows 20 in the first hollow group 301, which facilitates the manufacturing. The shape and size of the fourth hollow 204 are respectively the same as the shape and size of the first hollow 201, and the length of the first hollow 201 is different from the length of the second hollow 202. Arranging the second hollows 202 at both ends of the second hollow group 302 makes the hollows 20 of the first hollow group 301 and the hollows 20 of the second hollow group 302 to be staggered with each other and the boundaries at two ends of the first hollow group 301 and the second hollow group 302 to be both flush. In a process of bending the flexible support plate, a phenomenon of stress concentration at two ends of the bendable region 100 can be improved, and the possibility of the flexible support plate being damaged is decreased.

In an implementation of the embodiments of the present disclosure, the length L2 of the second hollow 202 is equal to a difference of the length L1 of the first hollow 201 minus the second spacing H2 divided by 2. That is:

$$L2 = \frac{L1 - H2}{2}. \quad (1)$$

It is assumed that in FIG. 6, the first hollow group 301 includes N hollows 20 (N is a positive integer greater than 2). There are (N−1) second spacings H2 between the N hollows 20. Specifically, the first hollow group 301 include two first hollows 201 and (N−2) third hollows 203. In this case, the second hollow group 302 includes (N+1) hollows 20, and there are N second spacings H2 between the (N+1) hollows 20. Specifically, the second hollow group 302 includes two second hollows 202 and (N−1) fourth hollows 204. Because the third hollow 203 and the fourth hollow 204 are both the same as the first hollow 201 and two ends of the first hollow group 301 and the second hollow group 302 are both flush, it may be acquired that N*N*L1+(N−1)*H2=(N−1)*L1+2*L2+N*H2, and Formula (1) may be acquired by simplifying the formula.

Arranging the second hollows 202 with relatively small lengths at two ends of the second hollow group 302 facilitates the arrangement of the hollows 20 in the bendable region 100, such that the hollows 20 in the bendable region 100 can realize mutual staggering and form a mesh structure in the bendable region 100, which can improve support of the flexible support plate in the bendable region 100 under the premise of ensuring the bending performance of the bendable region 100.

A finite element test is separately performed on the flexible support plate provided in the embodiment of the present disclosure and the flexible support plate in the related art. Stress at a connecting portion between two adjacent hollows 20 of the flexible support plate is measured.

Figure 7:
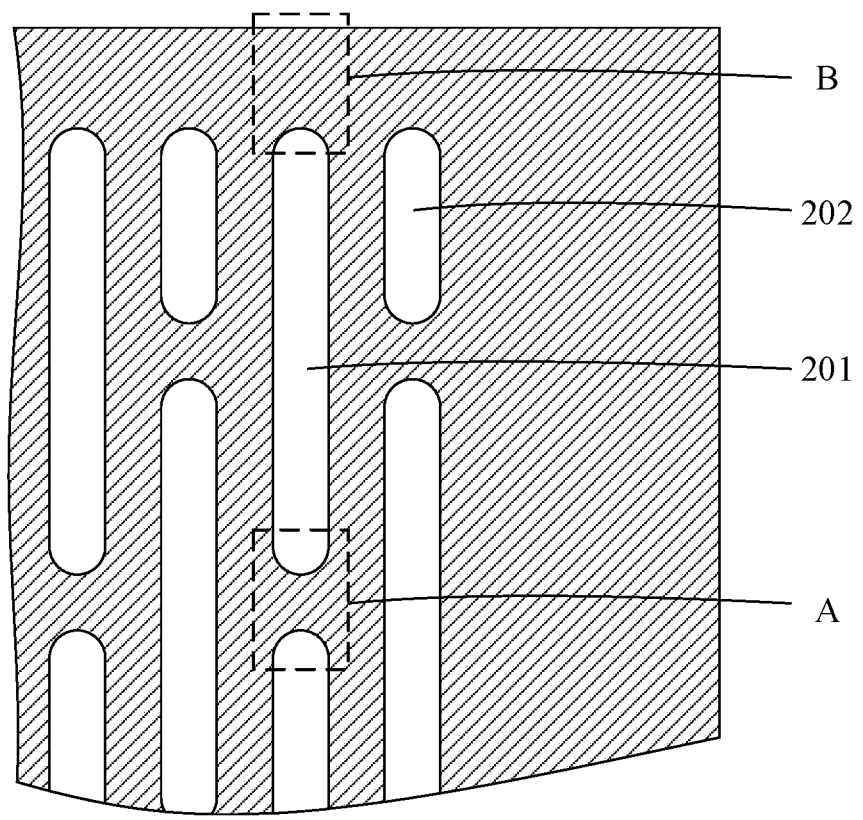
FIG. 7 is a partial enlarged view of a boundary of a bendable region according to an embodiment of the present disclosure.

FIG. 7 is a partial enlarged view of a boundary of a bendable region according to an embodiment of the present disclosure. Referring to FIG. 7, it is measured that stress at a connecting portion A between two adjacent hollows 20 of a flexible support plate in the related art is 511 megapascals (Mpa), and stress at the connecting portion A between two adjacent hollows 20 of the flexible support plate provided in the embodiment of the present disclosure is 464 Mpa. According to test results, it is concluded that stress in the flexible support plate provided in the embodiment of the present disclosure is reduced, and the possibility of the flexible support plate being damaged is decreased.

In addition, during the test, it is measured that stress at portions B on two sides of the flexible support plate in the related art is 0.0035 Mpa, and stress at the portions B on the two sides of the flexible support plate provided in the embodiment of the present disclosure is 589 Mpa. In comparison, stress in the flexible support plate provided in the embodiment of the present disclosure has relatively small fluctuations, such that the flexible support plate is further less likely to be damaged.

In a finite element test, one side of the flexible support plate is fixed, and the other side of the flexible support plate is rotated around a bending line of the bendable region of the flexible support plate to implement the bending of the flexible support plate.

In some embodiments, a rotation angle is 180 degrees, and a bending radius is 5 mm.

In the embodiment of the present disclosure, a width L3 of the bendable region 100 in a first direction a is related to a bending radius of the flexible support plate during the bending. The width L3 of the bendable region 100 is a sum of the bending radius multiplied by $\pi$ plus cushioning distances on two sides.

For example, when the bending radius is 5 mm, and a range of the width L3 of the bendable region 100 is 20 mm to 25 mm.

For example, the width L3 of the bendable region 100 is 21.7 mm, where 21.7=3+5*$\pi$+3.

Figure 8:
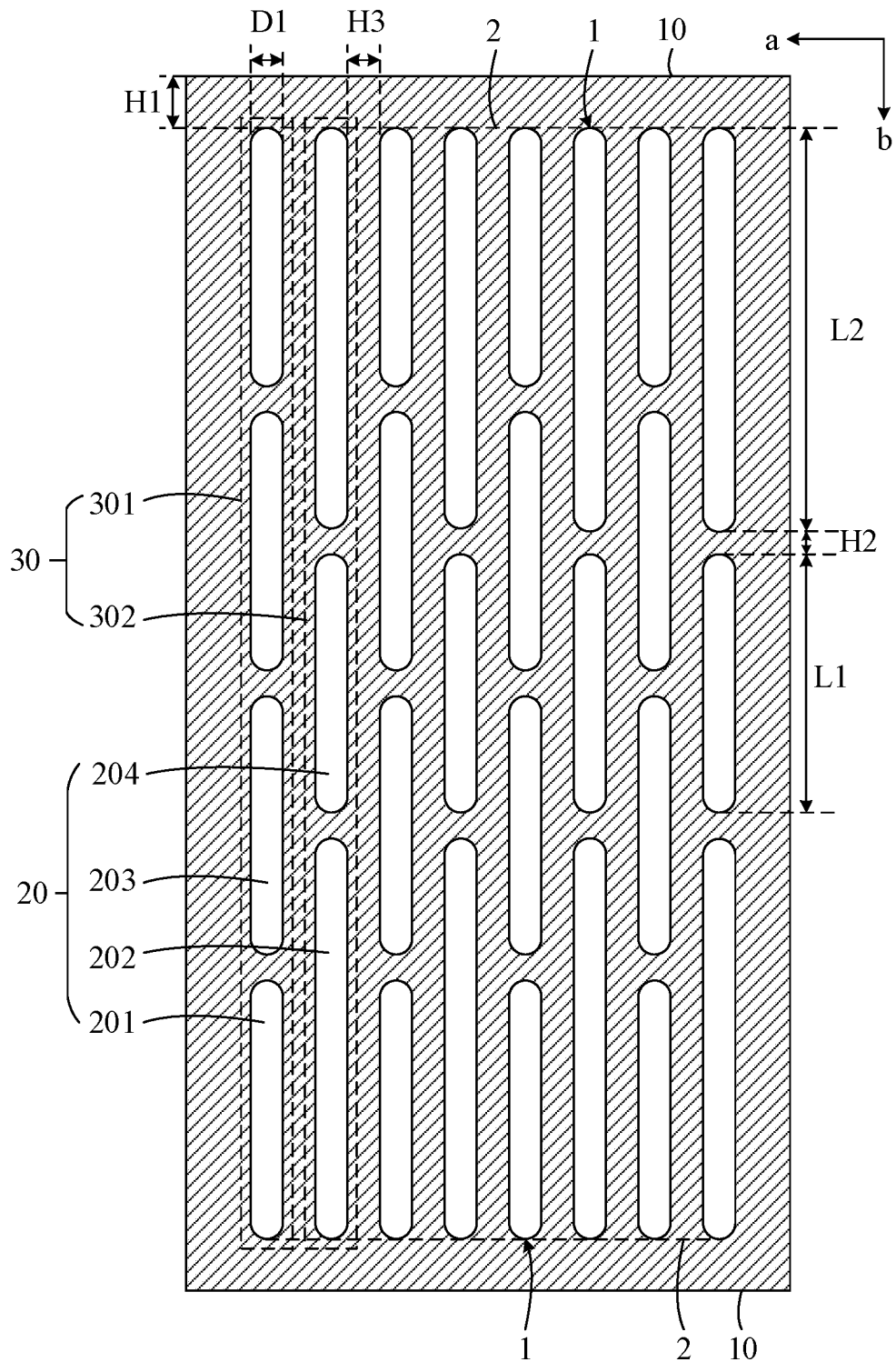
FIG. 8 is a partial enlarged view of a bendable region of a flexible support plate according to an embodiment of the present disclosure.

FIG. 8 is a partial enlarged view of a bendable region of a flexible support plate according to an embodiment of the present disclosure. A difference between FIG. 8 and FIG. 6 lies in that that a length L2 of a second hollow 202 is greater than a length L1 of a first hollow 201 in FIG. 8. Specifically, the length L2 of the second hollow 202 is equal to a sum of three times the length L1 of the first hollow 201 and a second spacing H2 divided by 2. That is:

$$L2 = \frac{3L1 + H2}{2}. \quad (2)$$

It is assumed that in FIG. 8, a first hollow group 301 includes M hollows 20 (M is a positive integer greater than 3) and there are (M−1) second spacings H2 between the M hollows 20. Specifically, the first hollow group 301 includes two first hollows 201 and (M−2) third hollows 203. A second hollow group 302 includes M−1 hollows 20 and there are (M−2) second spacings H2 between the (M−1) hollows 20. Specifically, the second hollow group 302 includes two second hollows 202 and (M−3) fourth hollows 204. Because the third hollow 203 and the fourth hollow 204 are both the same as the first hollow 201 and two ends of the first hollow group 301 and the second hollow group 302 are flush, in can be acquired that M*L1+(M−1)*H2=(M−3)*L1+2*L2+(M−2)*H2. Formula (2) may be acquired by simplifying the formula.

To ensure that boundaries, close to a boundary line 10, of the first hollow group 301 and the second hollow group 302 are flush, the length L2 of the second hollow 202 may be set shorter than the length L1 of the first hollow 201 as in FIG. 6, or the length L2 of the second hollow 202 may be set longer than the length L1 of the first hollow 201 as in FIG. 8, such that a phenomenon of stress concentration is improved, and the flexible support plate is less likely to be damaged.

In an implementation of the embodiments of the present disclosure, a range of the length L1 of the first hollow 201 in a second direction b is 3 mm to 5 mm.

The length L1 of the first hollow 201 is controlled, such that more hollows 20 can be arranged in the bendable region 100 of the flexible support plate, and the bending performance of the flexible support plate in the bendable region 100 is improved. In addition, a size of the hollow 20 in the bendable region 100 can be prevented from becoming excessively large and affecting the support of the flexible support plate.

For example, in the second direction b, the length L1 of the first hollow 201 is 4 mm.

When the length L1 of the first hollow 201 is 4 mm and the second spacing H2 is 0.1 mm, the length L2 of the second hollow 202 in FIG. 6 is 1.95 mm and the length L2 of the second hollow 202 in FIG. 8 is 6.05 mm.

In FIG. 6 and FIG. 8, the hollow groups 30 include only the first hollow group 301 and the second hollow group 302, that is, two hollow groups. In other implementations, the hollow groups 30 may include a plurality of hollow groups.

Figure 9:
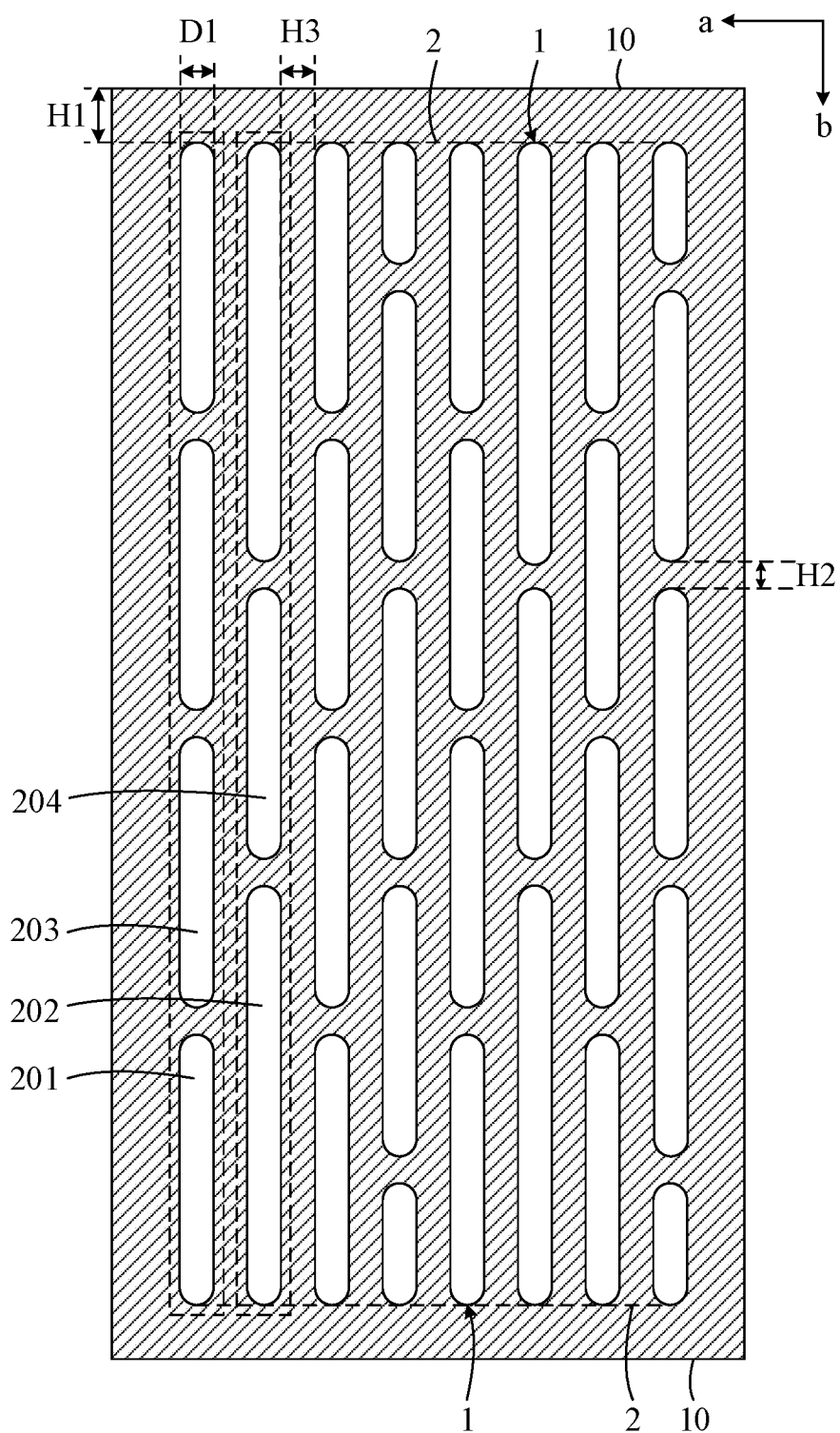
FIG. 9 is a partial enlarged view of a bendable region of a flexible support plate according to an embodiment of the present disclosure.

FIG. 9 is a partial enlarged view of a bendable region of a flexible support plate according to an embodiment of the present disclosure. Referring to FIG. 9, the hollow groups 30 include the first hollow group 301 arranged in a first direction, the second hollow group 302 and the first hollow group 301 in FIG. 8, and the second hollow group 302 in FIG. 6, and cycle in this way.

In other implementations, the hollow groups 30 may cycle in other ways, which is not limited in the present disclosure.

In FIGS. 6-9, the hollows 20 in two adjacent lines of hollow groups 30 have different shapes, sizes, and arrangements. In other implementations, the hollows 20 in two adjacent lines of hollow groups 30 may have an identical shape, size, and arrangement.

Figure 10:
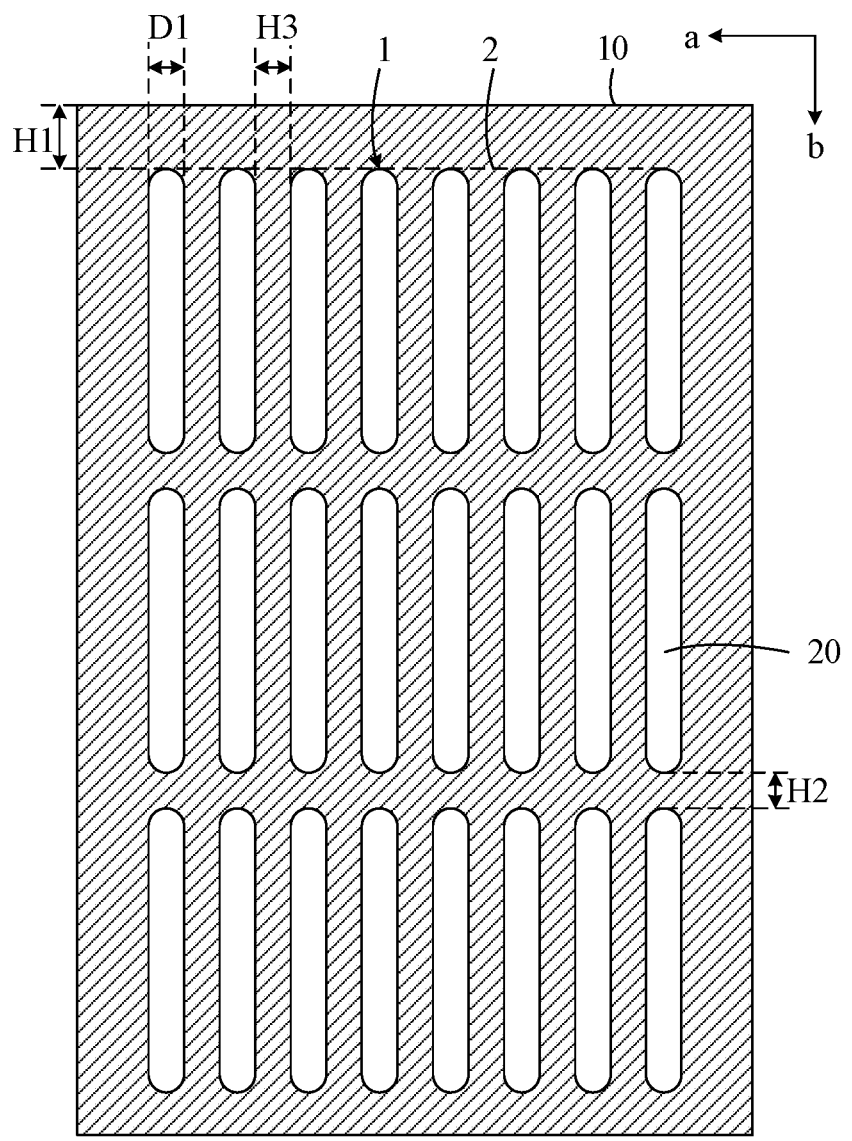
FIG. 10 is a partial enlarged view of a bendable region of a flexible support plate according to an embodiment of the present disclosure.

FIG. 10 is a partial enlarged view of a bendable region of a flexible support plate according to an embodiment of the present disclosure. Referring to FIG. 10, the hollows 20 in two adjacent lines of hollow groups 30 have an identical shape, size, and arrangement.

In an implementation of the embodiments of the present disclosure, the hollow 20 is a slotted hole. The slotted hole has semicircles at two ends and a rectangle in the middle, a diameter of the semicircle is equal to a length of a short side of the rectangle, and a long side of the rectangle is tangent to the semicircles so as to provide a contour line of the slotted hole with a smooth transition and a phenomenon of stress concentration can be improved.

In the embodiment of the present disclosure, a range of a width D1 of the slotted hole is 0.1 mm to 0.3 mm. The width D1 of the slotted hole is equal to a spacing between two long sides of the rectangle.

A width of the hollow 20 is restricted so that more hollows can be arranged in the bendable region 100 of the flexible support plate, to improve the bending performance of the flexible support plate in the bendable region 100. In addition, a size of the hollow of the bendable region 100 is prevented from becoming excessively large, and affecting the support of the flexible support plate.

In the embodiment of the present disclosure, the width D1 of the slotted hole in a first direction a is equal to the diameter of the semicircle of the slotted hole. That is, a range of the diameter of the semicircle of the slotted hole in the first direction a is 0.1 mm to 0.3 mm.

In other implementations, the hollow 20 may further have other shapes. For example, the hollow 20 may be a rectangular hole, a rhombic hole, a circular hole, or the like.

In the embodiment of the present disclosure, third spacings H3 between two adjacent hollows 20 in the first direction a are equal. In this way, widths of connecting portions between two adjacent hollows 20 in the first direction a are equal to ensure the uniformity of the support of the flexible support plate in the bendable region 100.

In the embodiment of the present disclosure, a range of the third spacing H3 between two adjacent hollows 20 in the first direction a is 0.05 mm to 0.15 mm.

In the embodiment of the present disclosure, the third spacing H3 between two adjacent hollows 20 in the first direction a is restricted, so that more hollows 20 can be arranged in the bendable region 100 of the flexible support plate to improve the bending performance of the flexible support plate in the bendable region 100.

For example, the third spacing H3 is 0.1 mm.

In the flexible support plate shown in FIG. 6 to FIG. 10, the bendable region 100 is a whole without division of regions. In other implementations, the bendable region 100 may be divided into a plurality of subregions.

Figure 11:
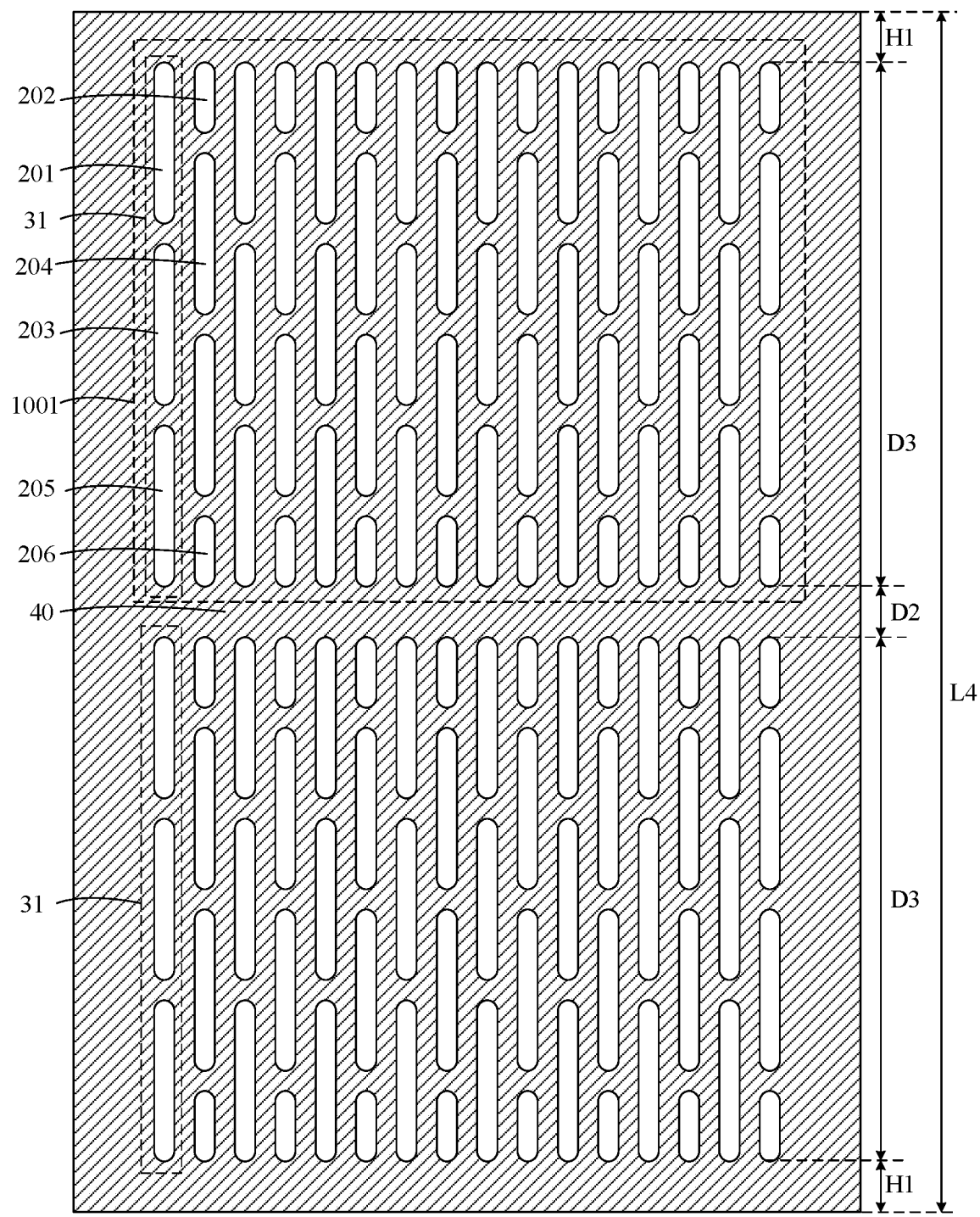
FIG. 11 is a partial enlarged view of a bendable region of a flexible support plate according to an embodiment of the present disclosure.

FIG. 11 is a partial enlarged view of a bendable region of a flexible support plate according to an embodiment of the present disclosure. Referring to FIG. 11, the bendable region 100 includes a plurality of subregions 1001 arranged at intervals in a second direction. The hollow group 30 includes a plurality of sub-hollow groups 31 arranged at intervals in the second direction b, the plurality of sub-hollow groups 31 and the plurality of subregions 1001 are in a one-to-one correspondence, and each of the plurality of sub-hollow groups 31 is disposed in corresponding subregions 1001. The second direction b is an extension direction of a bending line when the bendable region 100 is bent. For any boundary line 10, a connecting line of boundary points, at the smallest distance from the boundary line 10, of the hollows 20 in each subregion 1001 is a line segment. That is, a connecting line, close to the boundary line, of each subregion 1001 is smooth.

In the embodiment of the present disclosure, adjacent subregions 1001 are separated from each other, such that the support of the flexible support plate in the bendable region 100 can be improved. In addition, a restoration capability of the bendable region 100 of the flexible support plate after bending can be improved, and a phenomenon that crease occurs in the bendable region 100 of the flexible support plate is improved.

In the embodiment of the present disclosure, an interval 40 is a non-hollow region between two adjacent subregions 1001 of the flexible support plate.

Figure 12:
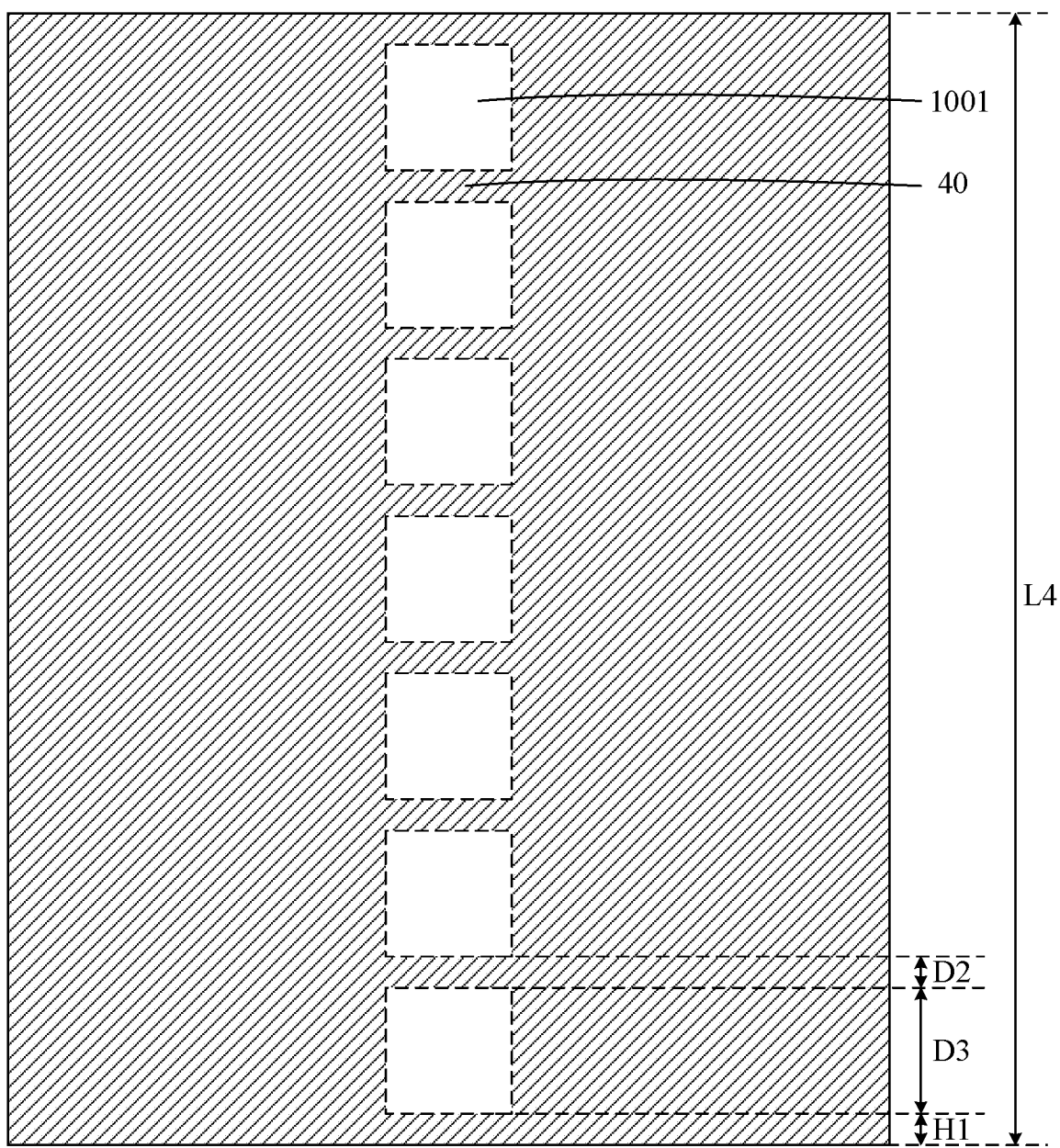
FIG. 12 is a schematic diagram of a top view structure of a flexible support plate according to an embodiment of the present disclosure.

FIG. 12 is a schematic diagram of a top view structure of a flexible support plate according to an embodiment of the present disclosure. Referring to FIG. 12, a plurality of subregions 1001 in a bendable region 100 are separated from each other.

In the embodiment of the present disclosure, a range of a width D2 of the interval 40 between any two adjacent subregions 1001 in a second direction b in the plurality of subregions 1001 is 0.2 mm to 1 mm.

In the embodiment of the present disclosure, the width D2 of the interval 40 is restricted, so that more subregions 1001 can be arranged in the bendable region 100 of the flexible support plate to improve the bending performance of the flexible support plate in the bendable region 100. In addition, the width D2 of the interval 40 is ensured, thereby ensuring the support of the flexible support plate in the bendable region 100.

In the embodiment of the present disclosure, a range of a quantity of the subregions 1001 is 2 to 10.

In the embodiment of the present disclosure, the quantity of the subregions 1001 is restricted, so that the subregions 1001 in the bendable region 100 of the flexible support plate can be scattered to improve the bending performance of the flexible support plate in the bendable region 100.

In the embodiment of the present disclosure, the hollows 20 in the plurality of sub-hollow groups 31 arranged in the second direction b all have an identical arrangement, shape, size, and quantity.

In the embodiment of the present disclosure, when the bendable region 100 of the flexible support plate includes a plurality of subregions 1001, a first hollow group 301 further includes fifth hollows 205 which are hollows at two ends of the subregions 1001 disposed in the middle. A shape and a size of the fifth hollow 205 are both the same as a shape and a size of a first hollow 201. A second hollow group 302 further includes sixth hollows 206 which are hollows at two ends of subregions 1001 disposed in the middle. A shape and size of the sixth hollow 206 are both the same as a shape and size of a second hollow 202.

In the embodiment of the present disclosure, a length D3 of the subregion 1001 in the second direction b is related to the quantity of the subregions 1001, the width D2 of the interval 40, and a length L4 of the bendable region 100. In practice, after determining the length L4 of the bendable region 100, the bending performance of the bendable region 100 can be simulated by finite elements with different widths D2 of the interval 40, different lengths D3 of the subregion 1001, and different quantities of the subregions 1001, and then the length D3 of the subregion 1001, the quantity of the subregions 1001, and the width D2 of the interval 40 are determined according to the required bending performance.

In the embodiment of the present disclosure, a length L4 and a width L5 of the flexible support plate may be restricted based on a size of a display panel that the flexible support plate actually needs to support.

For example, when the flexible support plate is applied to a display panel of a notebook (NB), a range of the length L4 of the flexible support plate in the second direction b is 250 mm to 300 mm and the width L5 of the flexible support plate in the first direction a may be determined based on a specific size of the NB.

Figure 13:
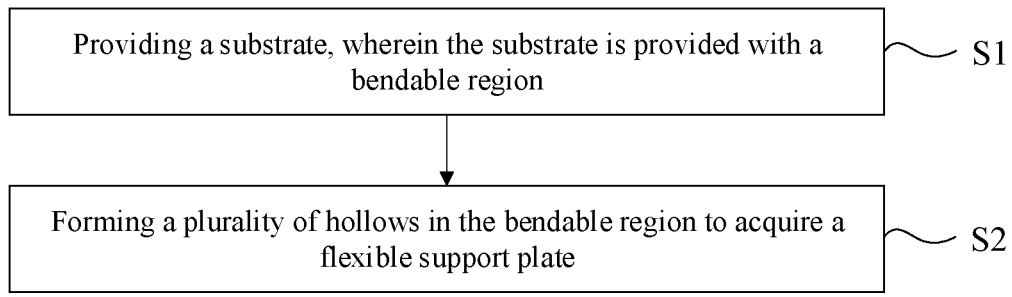
FIG. 13 is a flowchart of a method for manufacturing a flexible support plate according to an embodiment of the present disclosure.

The embodiments of the present disclosure further provide a method for manufacturing a flexible support plate. FIG. 13 is a flowchart of a method for manufacturing a flexible support plate according to an embodiment of the present disclosure. Referring to FIG. 13, the method includes the following steps.

In step S1, a substrate is provided, where the substrate is provided with a bendable region having at least one boundary line extending in a first direction, and the boundary line is part of a side of the substrate.

In the embodiment of the present disclosure, the substrate is a titanium plate or an alloy plate. The titanium plate and the alloy plate not only have a certain strength to ensure the support of the substrate but also the titanium plate and the alloy plate have a certain bendability to ensure the bendability of the substrate.

In step S2, a plurality of hollows are formed in the bendable region, where the plurality of hollows are divided into a plurality of hollow groups arranged in the first direction, each hollow group includes at least one hollow, for any boundary line, any one of the plurality of hollow groups has one boundary point, the boundary point is disposed on a contour line of a hollow in the hollow group to which the boundary point belongs, and the boundary point has the smallest distance from the corresponding boundary line in the contour line to which the boundary point belongs, and a connecting line of boundary points that is close to the same boundary line is a line segment.

In the embodiment of the present disclosure, the bendable region of a flexible support plate may be patterned by using a photomask and a process such as coating, masking, exposure, development, and etching to provide hollows in the bendable region of the flexible support plate.

The embodiments of the present disclosure further provide a display device. The display device includes the flexible support plate shown in any one of FIG. 5 to FIG. 12 and a display panel disposed on the flexible support plate.

Figure 14:
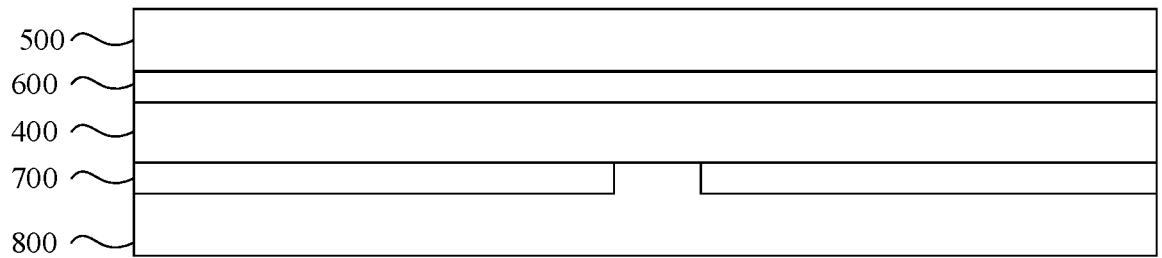
FIG. 14 is a schematic cross-sectional view of a display device according to an embodiment of the present disclosure.

FIG. 14 is a schematic cross-sectional view of a display device according to an embodiment of the present disclosure. Referring to FIG. 14, the display device includes a flexible support plate 400 and a display panel 500 disposed on the flexible support plate 400.

In the flexible support plate provided in the embodiment of the present disclosure, for any boundary line, boundary points of hollow groups in a bendable region are at the same line segment. In this case, a connecting line of hollows that is close to the boundary line is smooth, such that a boundary of the hollow in the flexible support plate has a smooth transition, and there is no notch, groove, or the like. When the flexible support plate provided in the embodiment of the present disclosure is bent in the bendable region, a phenomenon of stress concentration at a boundary of a hollow can be improved, and the possibility of the flexible support plate being damaged is decreased.

Referring to FIG. 14 again, the flexible support plate 400 and the display panel 500 are connected by a first bonding layer 600 to ensure the firmness of bonding between the flexible support plate 400 and the display panel 500.

In an implementation of the embodiments of the present disclosure, the first bonding layer 600 is an optically clear adhesive (OCA) layer. The adhesiveness of the OCA is adequate to ensure the firmness of the connection between the flexible support plate 400 and the display panel 500.

Alternatively, in other implementations, the first bonding layer 600 is a pressure sensitive adhesive (PSA) layer or the first bonding layer 600 is a foam layer.

In the embodiment of the present disclosure, the material of the first bonding layer 600 disposed in a first plane region 200 of the flexible support plate 400 may be the same as or different from the material of the first bonding layer 600 disposed in the bendable region 100 of the flexible support plate 400. This is not limited in the present disclosure.

In an implementation of the embodiments of the present disclosure, a range of a thickness of the first bonding layer 600 is 100 μm to 300 μm.

In the embodiment of the present disclosure, the thicker the first bounding layer 600, the better the solidity of the connection between the flexible support plate 400 and the display panel 500 but this would increase a thickness of the display device. In this case, the bending performance of the display device is reduced. The thickness of the first bonding layer 600 is restricted between 100 μm and 300 μm, which can not only ensure the firmness of the connection between the flexible support plate 400 and the display panel 500 but also can prevent the first bonding layer 600 from becoming excessively thick and can further avoid affecting the bendability of the flexible support plate.

For example, the thickness of the first bonding layer 600 is 150 μm.

Because the hollows 20 are provided in the flexible support plate 400 and a bonding adhesive has certain flowability, in a process of manufacturing the display device, a liquid bonding adhesive enters the hollows 20. After the bonding adhesive is cured, there is part of the cured bonding adhesive in the hollows 20. That is, the hollows 20 is provided with the first bonding layer 600. However, the bonding adhesive does not fill all the hollows 20 and only fills part of the hollows 20. The first bonding layer 600 disposed in the hollows 20 can improve an imprinting phenomenon on the surface of the display panel 500.

Referring to FIG. 14 again, the flexible support plate 400 is connected to a complete-machine module 800 by a second bonding layer 700.

In some embodiments of the present disclosure, the second bonding layer 700 may be a foam layer.

In the embodiment of the present disclosure, a part corresponding to the bendable region 100 in the second bonding layer 700 is hollow. Before the second bonding layer 700 bonds the flexible support plate 400 and the complete-machine module 800, a whole formed by the display panel 500, the first bonding layer 600, the flexible support plate 400, and the second bonding layer 700 is laminated to ensure the firmness of connections among the display panel 500, the first bonding layer 600, the flexible support plate 400, and the second bonding layer 700. Before lamination, a plastic (PET) cushion block may be placed at the part corresponding to the bendable region 100 in the second bonding layer 700 to ensure the levelness of the second bonding layer 700 and facilitate lamination. After the lamination is completed, the cushion block is removed, and then the second bonding layer 700 is attached to the complete-machine module 800. A protrusion 8001 is disposed at the part corresponding to the bendable region 100 in the complete-machine module 800. The protrusion 8001 fills a hollow part in the second bonding layer 700 to implement the assembly of the complete-machine module 800.

Figure 15:
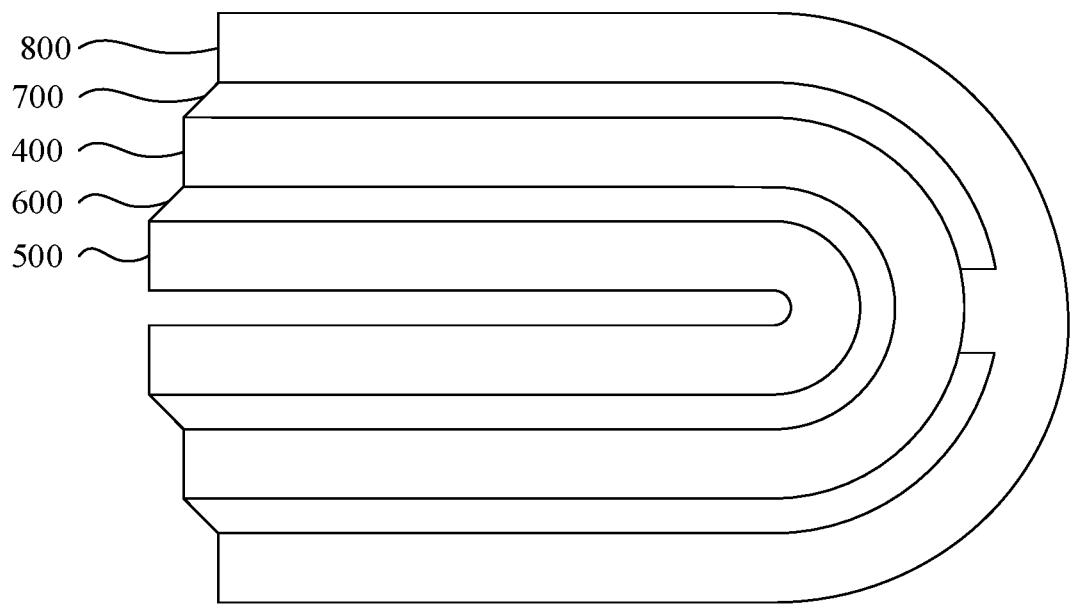
FIG. 15 is a schematic cross-sectional view of a display device according to an embodiment of the present disclosure when it is folded.

FIG. 15 is a schematic cross-sectional view of a display device is folded according to an embodiment of the present disclosure when it is folded. Referring to FIG. 15, when the display device is folded, because different film layers have different bending curvatures, bending lengths are different. Because the first bonding layer 600 and the second bonding layer 700 are more easily bendable, there is a dislocation amount, such that at an end away from a first plane display region 12, boundaries of different film layers in the display device are not flush and present a step form.

The display device provided in the embodiment of the present disclosure is a liquid crystal display (LCD) device or is an organic light-emitting diode (OLED) display device. During specific description, the display device provided in the embodiment of the present disclosure may be a mobile phone, a tablet computer, a television, a display, a notebook computer, a digital frame, a navigator or any other product or component having a display function and a folding function.

Described above are merely optional embodiments of the present disclosure, but are not intended to limit the present disclosure. Any modifications, equivalent replacements, improvements and the like made within the spirit and principles of the present disclosure shall be included within the scope of protection of the present disclosure.

What is claimed is:

1. A flexible support plate, wherein the flexible support plate is configured to support a display panel, the flexible support plate is provided with a bendable region, the bendable region has at least one boundary line extending in a first direction, and the boundary line is part of a side of the flexible support plate;
   a plurality of hollows are arranged at intervals in the bendable region, the plurality of hollows are divided into a plurality of hollow groups arranged in the first direction, and each hollow group comprises at least one hollow;
   for any boundary line, any one of the plurality of hollow groups has one boundary point, the boundary point is disposed on a contour line of a hollow in the hollow group to which the boundary point belongs, and the boundary point has a smallest distance from a corresponding boundary line in the contour line to which the boundary point belongs; and
   a connecting line of boundary points that are close to a same boundary line is a line segment; and wherein the bendable region comprises a plurality of subregions arranged at intervals in a second direction, and the second direction is the extension direction of the bending line when the bendable region is bent; and the hollow group comprises a plurality of sub-hollow groups arranged at intervals in the second direction, the plurality of sub-hollow groups and the plurality of subregions are in a one-to-one correspondence, and the sub-hollow groups in the plurality of sub-hollow groups are all disposed in corresponding subregions.

2. The flexible support plate according to claim 1, wherein the line segment is parallel to the corresponding boundary line.

3. The flexible support plate according to claim 2, wherein a range of a first spacing between the line segment and the corresponding boundary line is 0.2 mm to 1 mm.

4. The flexible support plate according to claim 1, wherein the hollow groups comprise a plurality of lines of first hollow groups and a plurality of lines of second hollow groups that are alternately arranged;
   hollows in the first hollow group extend and are arranged in a second direction, hollows in the second hollow group extend and are arranged in the second direction, and the second direction is an extension direction of a bending line when the bendable region is bent;
   a hollow closest to the corresponding boundary line in the first hollow group is a first hollow and a hollow closest to the corresponding boundary line in the second hollow group is a second hollow and
   in the second direction, a length of the first hollow is different from a length of the second hollow.

5. The flexible support plate according to claim 4, wherein the hollows in the first hollow group comprise two first hollows and at least one third hollow, and the at least one third hollow is disposed between the two first hollows;
   the hollows in the second hollow group comprise two second hollows and at least one fourth hollow, and the at least one fourth hollow is disposed between the two second hollows; and
   a shape of the third hollow and a shape of the fourth hollow are both as same as a shape of the first hollow, and a size of the third hollow and a size of the fourth hollow are both as same as a size of the first hollow.

6. The flexible support plate according to claim 5, wherein a second spacing between two adjacent hollows in the second direction is equal in the same hollow group.

7. The flexible support plate according to claim 6, wherein a range of the second spacing is 0.05 mm to 0.15 mm.

8. The flexible support plate according to claim 6, wherein in the second direction, a length of the second hollow is equal to a difference of a length of the first hollow minus the second spacing divided by 2.

9. The flexible support plate according to claim 6, wherein in the second direction, the length of the second hollow is equal to a sum of three times the length of the first hollow and the second spacing divided by 2.

10. The flexible support plate according to claim 4, wherein a range of the length of the first hollow in the second direction is 3 mm to 5 mm.

11. The flexible support plate according to claim 1, wherein hollows in two adjacent lines of hollow groups have an identical shape, size, and arrangement.

12. The flexible support plate according to claim 1, wherein the hollow is a slotted hole.

13. The flexible support plate according to claim 12, wherein a range of a width of the slotted hole is 0.1 mm to 0.3 mm.

14. The flexible support plate according to claim 1, wherein a third spacing between two adjacent hollows in the first direction is equal.

15. The flexible support plate according to claim 14, wherein a range of the third spacing is 0.05 mm to 0.15 mm.

16. The flexible support plate according to claim 1, wherein the hollows in the plurality of sub-hollow groups arranged in the second direction all have an identical arrangement, shape, size, and quantity.

17. The flexible support plate according to claim 1, wherein a range of a width of an interval between any two adjacent subregions in the plurality of subregions in the second direction is 0.2 mm to 1 mm.

18. The flexible support plate according to claim 1, wherein a range of a quantity of the subregions is 2 to 10.

19. A method for manufacturing a flexible support plate, comprising:
   providing a substrate, wherein the substrate is provided with a bendable region, the bendable region has at least one boundary line extending in a first direction, and the boundary line is part of a side of the substrate; and
   forming a plurality of hollows in the bendable region to acquire a flexible support plate, wherein the plurality of hollows are divided into a plurality of hollow groups arranged in the first direction, each hollow group comprises at least one hollow, for any boundary line, any one of the plurality of hollow groups has one boundary point, the boundary point is disposed on a contour line of a hollow in the hollow group to which the boundary point belongs, and the boundary point has a smallest distance from a corresponding boundary line in the contour line to which the boundary point belongs, and a connecting line of boundary points that are close to a same boundary line is a line segment;
   and wherein the bendable region comprises a plurality of subregions arranged at intervals in a second direction, and the second direction is the extension direction of the bending line when the bendable region is bent; and
   the hollow group comprises a plurality of sub-hollow groups arranged at intervals in the second direction, the plurality of sub-hollow groups and the plurality of subregions are in a one-to-one correspondence, and the sub-hollow groups in the plurality of sub-hollow groups are all disposed in corresponding subregions.

* * * * *